United States Patent

Tanaka

[11] Patent Number: 6,033,936
[45] Date of Patent: Mar. 7, 2000

[54] METHOD OF MOUNTING AN LSI PACKAGE

[75] Inventor: Shinji Tanaka, Tokyo, Japan

[73] Assignee: NEC Corporation, Tokyo, Japan

[21] Appl. No.: 09/179,430

[22] Filed: Oct. 27, 1998

[30] Foreign Application Priority Data

Oct. 28, 1997 [JP] Japan ................................ 9-295064

[51] Int. Cl.⁷ ........................... H01L 21/44; H01L 21/48; H01L 21/50
[52] U.S. Cl. ........................... 438/119; 438/106; 438/118
[58] Field of Search ................................... 438/119, 106, 438/118

[56] References Cited

U.S. PATENT DOCUMENTS 4,323,914  4/1982  Berndlmaier et al. .
5,378,656  1/1995  Kajihara et al. .

FOREIGN PATENT DOCUMENTS 51-54260    5/1976   Japan .
54-11504    5/1979   Japan .
54-141564  11/1979   Japan .
60-123093   7/1985   Japan .
63-279179  11/1988   Japan .
4-320056   11/1992   Japan .
7-161866    6/1995   Japan .

Primary Examiner—Kevin M. Picardat
Assistant Examiner—D. M. Collins
Attorney, Agent, or Firm—Sughrue, Mion, Zinn Macpeak & Seas, PLLC

[57] ABSTRACT

To mount an LSI package to a wiring substrate, input/output pins for the LSI package are arranged on the wiring substrate beforehand. After solder has been fed to input/output pads formed on the package, the package is mounted to the wiring substrate by soldering the input/output and pins. The method allows the package to be easily removed from the wiring substrate if only the package is heated, and therby enhances repairability.

8 Claims, 6 Drawing Sheets

METHOD OF MOUNTING AN LSI PACKAGE

BACKGROUND OF THE INVENTION

The present invention relates to an integrated circuit for use in a data processing apparatus or similar electronic apparatus and, more particularly, to a method of mounting an LSI (Large Scale Integrated circuit) package.

In parallel with an increase in the degree of integration of LSIs for use in electronic apparatuses, the number of input/output terminals of an LSI is increasing, resulting in a multipin LSI configuration. On the other hand, to implement the dense mounting of a multipin LSI package, there is an increasing demand for an LSI package easy to produce and reliable.

Conventional LSI packages are taught in Japanese Patent Laid-Open Publication Nos. 7-161866 and 60-123093 by way of example. However, the problem with the conventional LSI packages is that because an LSI chip is soldered to a printed circuit board, the package cannot be removed after soldering unless the printed circuit board is locally heated. The package therefore brings about various limitations in the mounting aspect, e.g., prevents other electronic parts to be mounted therearound. It follows that the package cannot meet the increasing demand for dense arrangement. Further, heat locally applied to the printed circuit board for a single repair exerts a heavy stress on the circuit board and thereby degrades the reliability of the circuit board. It is therefore necessary to limit the number of times of repair, lowering the repairability of the package.

Technologies relating to the present invention are also disclosed in, e.g., Japanese Patent Laid-Open Publication No. 63-279179.

SUMMARY OF THE INVENTION

It is therefore an object of the present invention to provide an LSI package mounting method capable of enhancing the repairability of a densely arranged multipin LSI package when mounting the package to a printed circuit board.

In accordance with the present invention, to mount an LSI package to a wiring substrate, input/output pins for the LSI package are arranged on the wiring substrate beforehand. After solder has been fed to input/output pads formed on the package, the package is mounted to the wiring substrate by soldering the input/output pads and pins.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENT

Figure 1:
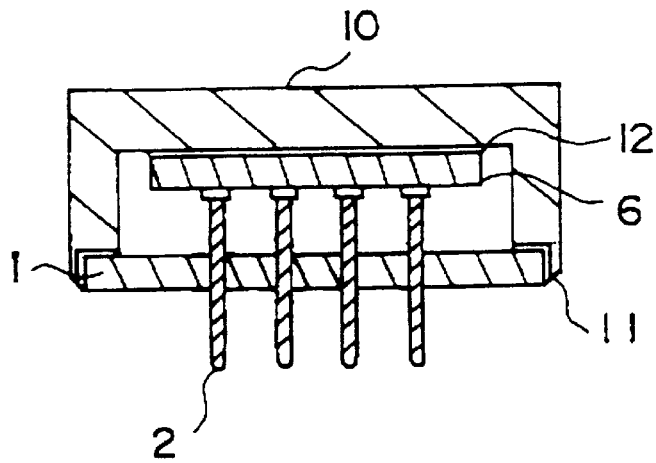
FIG. 1 shows a conventional LSI package.

To better understand the present invention, brief reference will be made to a conventional LSI package taught in Japanese Patent Laid-Open Publication No. 7-161866 mentioned earlier. As shown in FIG. 1, the conventional LSI package includes an LSI chip 6 provided with pads. Pins 2 are positioned in one-to-one correspondence to the pads of the chip 6 and extend throughout a carrier substrate 1. The chip 2 is soldered to a wiring substrate, not shown, via the pins 6. A cap 10 is die-bonded to the surface of the chip 6 opposite to the surface where circuitry is arranged by adhesive 12. The cap 10 and carrier substrate 1 are bonded together by a seal material 11 in order to hermetically seal the chip 6.

Figure 2:
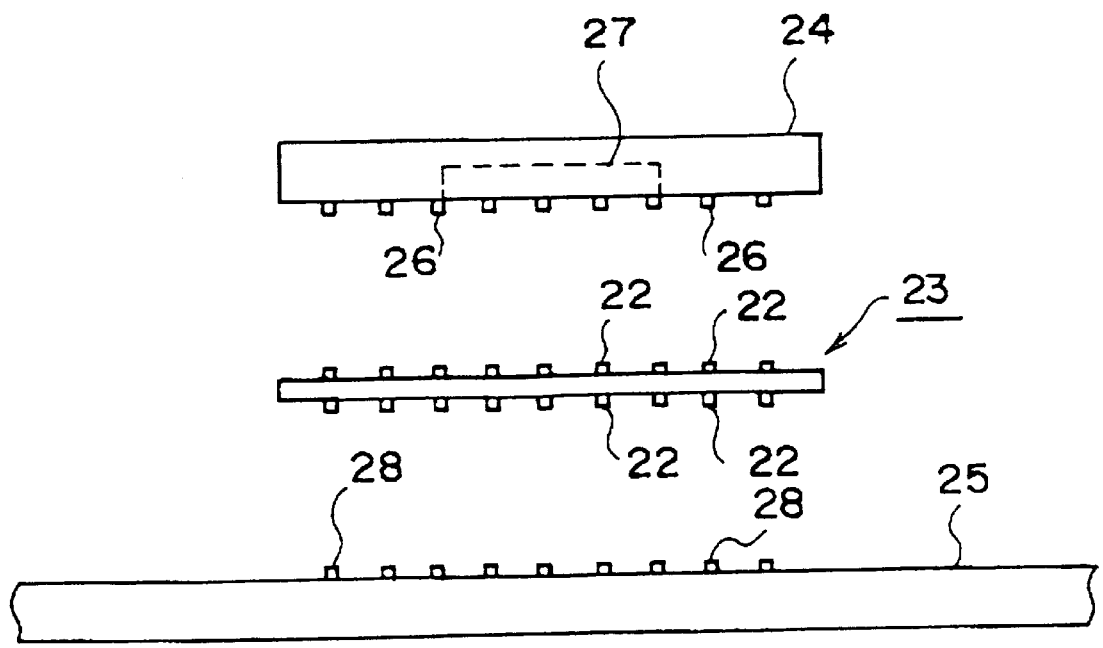
FIG. 2 shows another conventional LSI package and a method of mounting the same.

FIG. 2 shows another conventional LSI package disclosed in Japanese Patent Laid-Open Publication No. 60-123093 also mentioned earlier. As shown, the LSI package includes an LSI chip 27 mounted on the rear of a chip carrier substrate 24. A plurality of bumps 26 are arranged on the rear of the chip carrier substrate 24. Pins 22 are buried in a buffer plate 23 in one-to-one correspondence to the bumps 26, and each protrudes from the top and bottom of the buffer plate 23. A printed circuit board 25 having pads 28 and a chip carrier substrate 24 are connected together with the intermediary of the pins 22.

The above conventional LSI chips have some problems left unsolved, as stated earlier.

Figure 3:
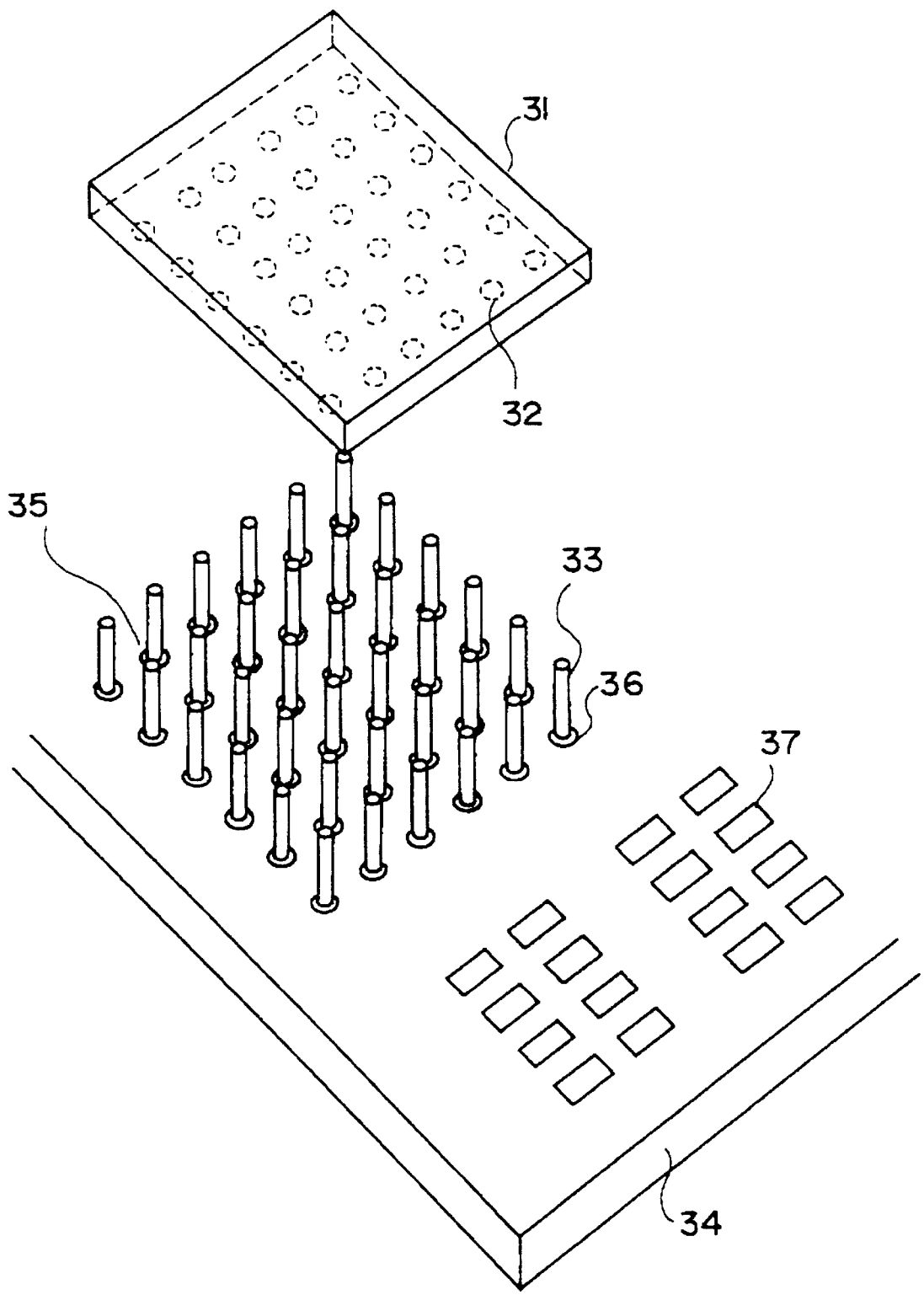
FIG. 3 is a perspective view showing an LSI package mounting method embodying the present invention.

Referring to FIG. 3, a method of mounting an LSI package embodying the present invention will be described. As shown, a laminate printed circuit board 34 including an insulator implemented by, e.g., glass epoxy resin constitutes a wiring substrate. Lands (through hole lands) 35 are formed in the mounting area of the printed circuit board 34 while through holes 36 are respectively formed in the lands 35. The number of the through holes 36 is the same as the number of input/output pins. Pins 33 are respectively press-fitted in the through holes 36 beforehand. The pins 33 are formed of Kovar and plated with Ni-Au. Pads 32 are formed on the underside of an LSI package 31. After solder has been fed to the pads 32 of the LSI package 31 by printing, the package 31 is mounted to the pins 33, as will be described more specifically later. Subsequently, the package 31 is soldered together with other electronic parts mounted on pads 37.

Figure 4:
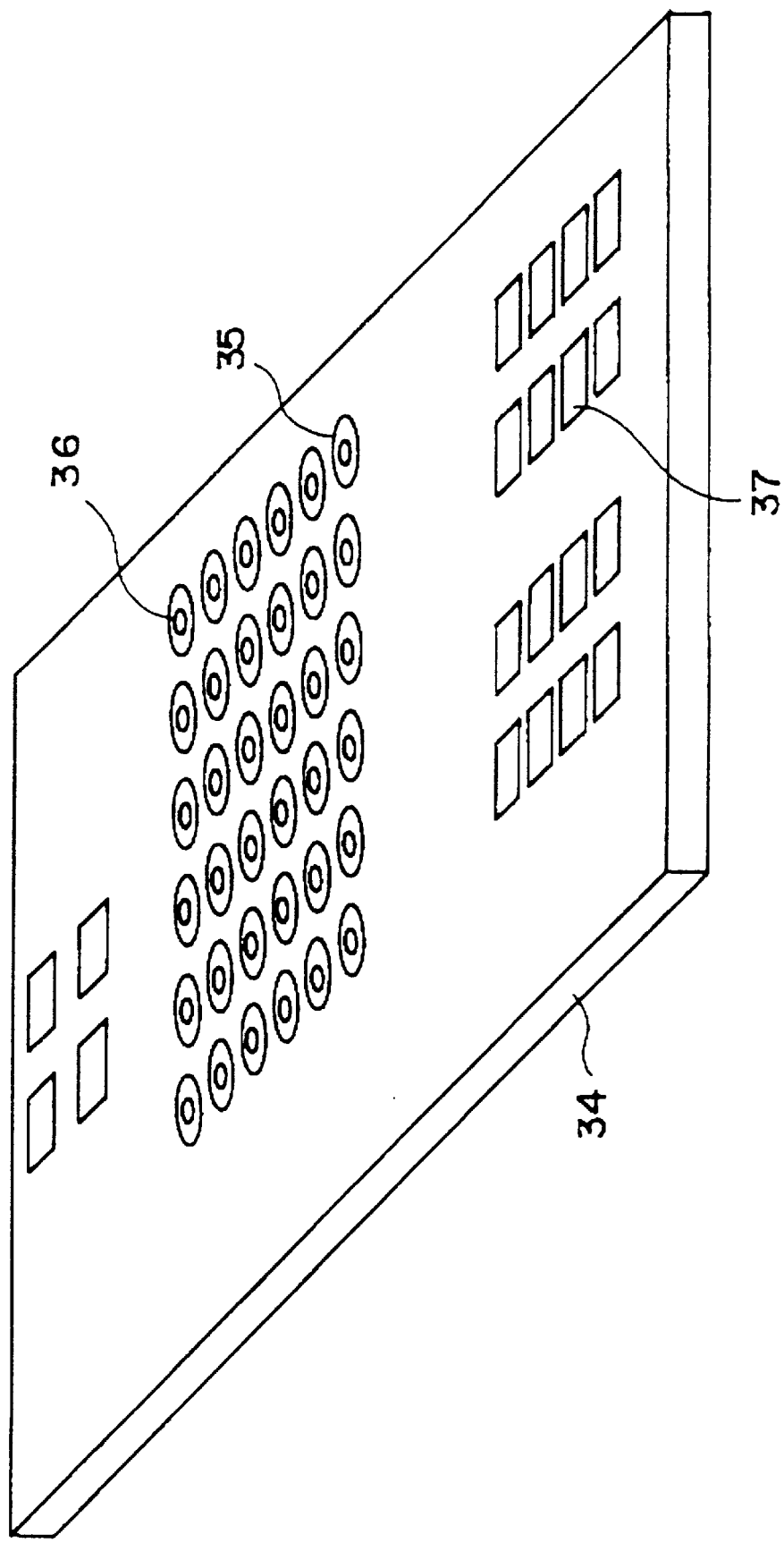
FIG. 4 is a perspective view of a printed circuit board applicable to the illustrative embodiment.

Reference will be made to FIGS. 4–7 for describing a procedure for mounting the LSI package 31 in detail. As shown in FIG. 4, the through holes 36 corresponding in number to the input/output pins are formed in the area of the printed circuit board 34 where the package 31 is to be mounted. For example, through holes 36 each having a diameter of 0.4 mm are formed in the through hole lands 35 each having a diameter of 0.8 mm. The printed circuit board 34 is a laminate wiring substrate including a plurality of wiring layers. After solder has been printed on the printed circuit board 4, other electronic parts mounted on the pads 37 are mounted to the circuit board.

Figure 5A:
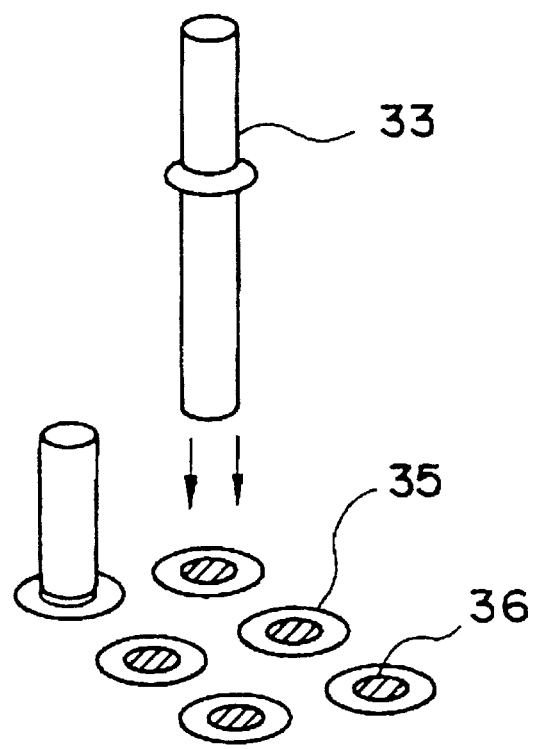
FIGS. 5A and 5B show how pins are press-fitted in through holes in the illustrative embodiment.
Figure 5B:
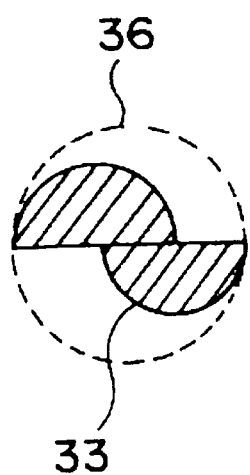

As shown in FIG. 5A, the pins 33 each having a diameter of 0.6 mm are respectively press-fitted in the through holes 36. When each pin 33 is press-fitted in the respective through hole 36, it contacts the wall of the through hole 36 plated with copper. As a result, electrical connection and mechanical support are implemented at the same time. As shown in FIG. 5B, the portion of each pin 33 to be press-fitted in the respective through hole 36 is so configured as to have resiliency. All the pins 33 are press-fitted in the through holes 36 at a time by use of an implement.

Figure 6:
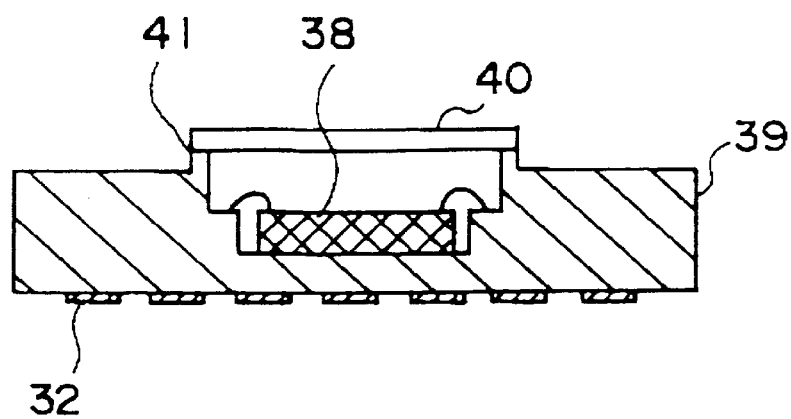
FIG. 6 shows a specific configuration of an LSI package applicable to the illustrative embodiment.

As shown in FIG. 6, an LSI 38 is mounted face up on a ceramic case 39 having a cavity structure, constituting the LSI package or ceramic package 31. A cap 40 formed of Kovar and plated with Ni-Au seals the ceramic case 39 by being sealed by a seal material 41 implemented by Au-Sn, thereby protecting the circuit surface of the LSI 38.

It has been customary with a PGA (Pin Grid Array) or similar LSI ceramic package to solder, before mounting the LSI 38, input/output pins to the underside of the package where the pads 32 are formed in a matrix configuration. The package 31 shown in FIG. 6 does not need such input/output pins.

Figure 7:
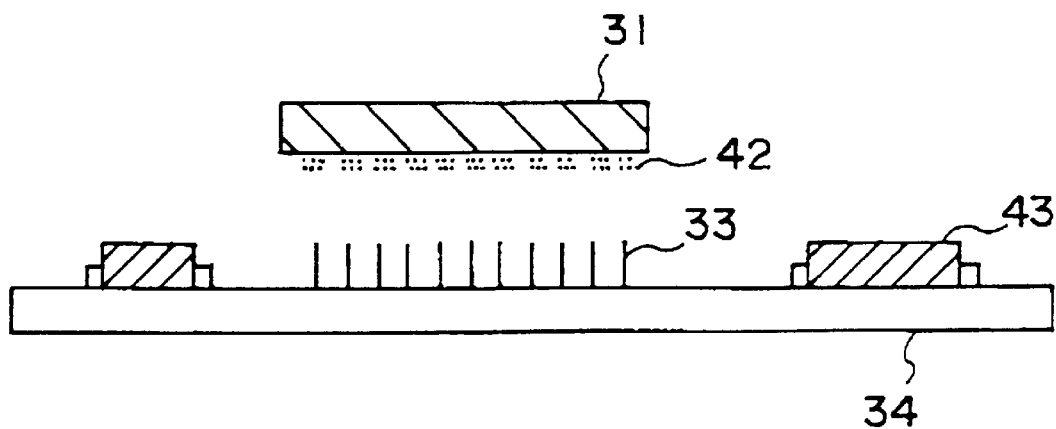
FIG. 7 shows a procedure for mounting the LSI package of FIG. 6 to the printed circuit board.
Figure 8:
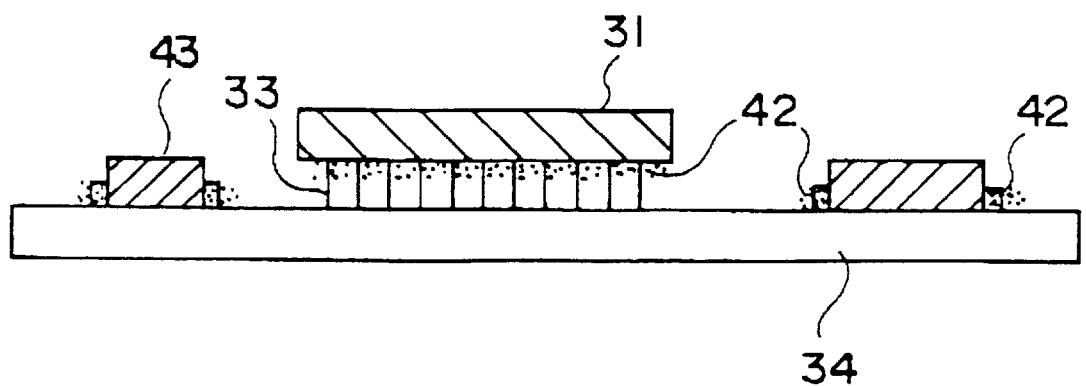
FIG. 8 shows the LSI package fully mounted to the printed circuit board.

As shown in FIG. 7, after solder 42 has been printed on the pads 32 present on the underside of the package 31, the package 31 is positioned and then mounted to the pins 33. Subsequently, the package 31 is subjected to reflow in a 200° C. to 250° C. atmosphere and then soldered together with other electronic parts 43, as shown in FIG. 8.

Figure 9:
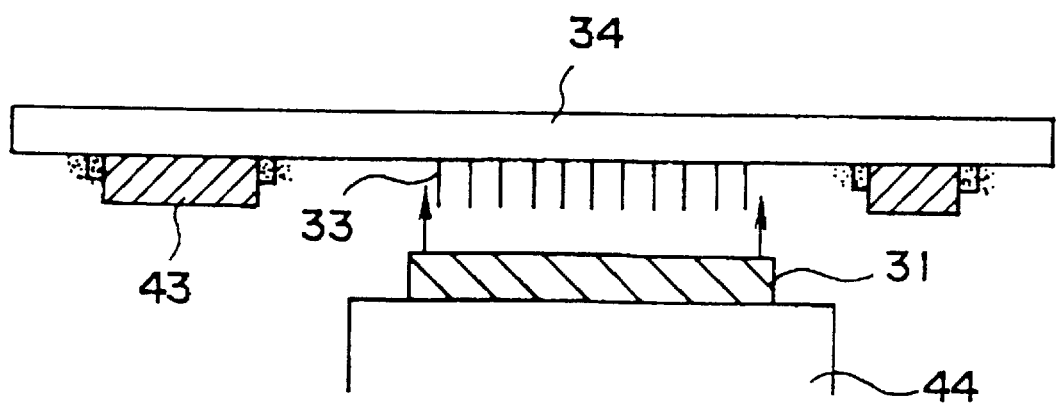
FIG. 9 shows how the LSI package is removed from the printed circuit board.

As shown in FIG. 9, the package 31 can be replaced only if the body of the package 31 is heated to fuse the solder 42 by using, e.g., a hot plate 44. The package 31 is therefore easy to mount and dismount.

While the LSI 38 is shown in FIG. 6 as being mounted on the ceramic case 39 face up, it may be mounted face down, if desired. Also, the input/output pins may be formed of copper and plated with Ni-Au.

In summary, it will be seen that the present invention provides an LSI package mounting method allowing an LSI package to be easily removed from a wiring substrate by heating only the package, and thereby improving repairability. This advantages is derived from a unique procedure in which input/output pins are press-fitted in through holes-formed in the wiring substrate, and then the package is mounted to the pins and soldered. Another advantage of the present invention is that because the input/output pins are press-fitted in the wiring substrate, it is not necessary to solder the pins to the package. This successfully reduces a period of time for the fabrication of the package.

Various modifications will become possible for those skilled in the art after receiving the teachings of the present disclosure without departing from the scope thereof.

What is claimed is:

1. A method of mounting an LSI package to a wiring substrate, comprising the steps of:

arranging input/output pins for said LSI package on said wiring substrate;

feeding solder to input/output pads formed on said LSI package; and mounting said LSI package to said wiring substrate on which said input/output pins are arranged by soldering said input/output pads and said pins.

2. A method as claimed in claim 1, wherein said wiring substrate comprises a laminate wiring substrate including a plurality of wiring layers.

3. A method as claimed in claim 1, wherein through holes are formed in said wiring substrate, said input/output pins being respectively press-fitted in said through holes.

4. A method as claimed in claim 1, wherein said LSI package is mounted to a ceramic case face up.

5. A method as claimed in claim 4, wherein said LSI package is mounted to said ceramic case face down.

6. A method as claimed in claim 1, wherein said solder is printed on said input/output pads.

7. A method as claimed in claim 1, further comprising the steps of removing said LSI package from said wiring substrate by heating said LSI package and fusing said soldering.

8. A method as claimed in claim 1, wherein said step of mounting said LSI package to said wiring substrate includes subjecting said LSI package to reflow.

* * * * *

UNITED STATES PATENT AND TRADEMARK OFFICE
CERTIFICATE OF CORRECTION

PATENT NO. : 6,033,936
DATED : March 7, 2000
INVENTOR(S) : Shinji Tanaka

It is certified that error appears in the above-indentified patent and that said Letters Patent is hereby corrected as shown below:

Column 2, line 13 delete "2", insert --6--;
       line 14 delete "pins 6", insert --pins 2--.

Signed and Sealed this

Twentieth Day of March, 2001

Attest:

NICHOLAS P. GODICI

Attesting Officer     Acting Director of the United States Patent and Trademark Office